United States Patent [19]

Wong

[11] Patent Number: 4,888,226
[45] Date of Patent: Dec. 19, 1989

[54] SILICONE GEL ELECTRONIC DEVICE ENCAPSULANT

[75] Inventor: Ching P. Wong, Lawrenceville, N.J.

[73] Assignee: American Telephone and Telegraph Company, New York, N.Y.

[21] Appl. No.: 229,403

[22] Filed: Aug. 8, 1988

[51] Int. Cl.$^4$ .............................................. B32B 9/04
[52] U.S. Cl. ........................................ 428/76; 357/72
[58] Field of Search ............................ 428/76; 357/72

[56] References Cited

U.S. PATENT DOCUMENTS

| | | | |
|---|---|---|---|
| 4,329,274 | 5/1982 | Faltynek | 524/862 |
| 4,564,562 | 1/1986 | Wong | 428/447 |
| 4,592,959 | 6/1986 | Wong | 428/450 |
| 4,599,374 | 8/1986 | Bluestein | 523/213 |
| 4,634,610 | 1/1987 | Keohan et al. | 427/387 |

Primary Examiner—Alexander S. Thomas
Attorney, Agent, or Firm—Roderick B. Anderson

[57] ABSTRACT

An article of manufacture comprising an electron device encapsulated by a silicone resin material consisting essentially of 15 to 30 weight percent of polydimethylsiloxane and/or polymethylphenylsiloxane resin including a platinum catalyst, 50 to 80 weight percent of silicon dioxide and 5 to 20 weight percent of a silicon hydride.

7 Claims, 1 Drawing Sheet

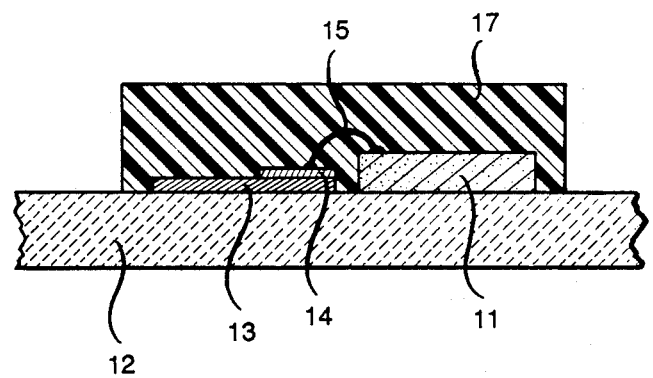

SILICONE GEL ELECTRONIC DEVICE ENCAPSULANT

BACKGROUND OF THE INVENTION

This invention relates to electronic devices which are encapsulated by a polymeric encapsulant, and more particularly, to such devices which are encapsulated by a silicone gel.

Silicone resins have been used for a number of purposes because of their relative thermal stability, dielectric properties, chemical stability and resistance to atmospheric deterioration. U.S. Pat. No. 4,564,562 of C. P. Wong, assigned to a subsidiary company of the present assignee, is one example of the prior art showing the use of silicone resins as an encapsulant for electronic devices particularly, hybrid integrated circuits. A hybrid integrated circuit is one in which a semiconductor chip, usually a silicon chip, is connected to a bonding pad region of a circuit pattern on a ceramic substrate. The Wong patent is directed to the use of certain additives in certain resins that improve their adhesion to gold and tantalum nitride surfaces, which are sometimes the metals used as the circuit patterns.

Wire bonding is a commonly used technique for interconnecting integrated circuit chips with substrates which involves forming a delicate wire that extends in an arc from the chip to the substrate. Silicone resins such as described in the Wong patent and various epoxies have been found to be sometimes undependable when used with wire bonded chips because the inevitable thermal stresses during curing tend to break the delicate interconnection wires. Silicone gels, which are platinum catalyzed silicone resins, either polydimenthylsiloxane or polymethylphenylsiloxane, having vinyl and hydride reactive functional components, are sufficiently elastic to encase the interconnection wires without breaking them, but after cure they retain a relatively soft rubber-like or jelly-like constituency. While this is adequate for many purposes, it will not protect delicate silicon chips from the effects of relatively rough handling. In particular, it tends to rip or tear if impacted, say, by a concern of a rigid object. Moreover, it is not sufficiently resistant to solvents such as Freon (a trademark of the Dupont Co.) which are used to clean hybrid integrated circuit substrates. For a more complete discussion of silicone gel encapsulations for electronic devices see "Application of Polymer in Encapsulation of Electronic Parts," by C.P. Wong, "Advances in Polymer Science," Vol. 84, Springer-Verlag, Berlin, Heidelberg, 1988, p. 64 at p. 78.

Alternative approaches to device encapsulation include packages made of hard rigid material such as plastic or ceramic that do not physically contact the chip or its leads. While such packages can withstand the rigors of rough handling, they do not encase the elements of an electronic device as a silicone resin does, and may therefore offer less protection from shocks and the like. Many materials such as plastic cannot encase a chip because of inadequate electrical properties; other materials such as epoxy cannot be used in this manner because thermal stresses during fabrication would break the delicate bonding wires. Thus, it would be beneficial to provide a encapsulant that is capable of flowing about an electronic device to encase it, has appropriate adhesive, electrical, thermal, solvent resistant and shock resistant properties, and still has a sufficiently hard outer surface to resist the effects of rough handling.

SUMMARY OF THE INVENTION

In accordance with the invention, an electron device is encapsulated by a material consisting essentially of 15 to 30 weight percent of a silicone gel (polydimethylsiloxane and/or polymethylphenylsiloxane having vinyl and hydride functional components) with a platinum catalyst, 50 to 80 weight percent of silicon dioxide, and 4 to 20 weight percent of a silicon hydride composition. In its uncured state, this material is viscous and can be flowed over an electronic device in the same manner as conventional silicone gels. However, as will be described more fully later, when it is cured, its outer surface becomes essentially hard and rigid, but the structure is still sufficiently elastic to absorb thermal stresses, especially thermal stresses on the bonding wires. Moreover, after cure the resin is sufficiently elastic to give a shock absorbing capability. As a consequence, one obtains the best characteristics of both silicone gel encapsulations and hard package encapsulations. In particular, one obtains such qualities as solvent resistance and adhesion to ceramic, gold and copper, along with the unique mechanical qualities described, which, to the best of my knowledge and belief, have not been attained by any other material.

These and other objects and advantages of the invention will be better understood from consideration of the following detailed description, taken in conjunction with the accompanying drawing.

BRIEF DESCRIPTION OF THE DRAWING

The drawing is a sectional view of an encapsulated electronic device in accordance with an illustrative embodiment of the invention.

DETAILED DESCRIPTION

The aforementioned Wong patent describes in some detail the need for silicone resins which are capable of bonding to gold terminal pads and which are resistant to solvents used for cleaning such devices. The patent includes illustrations of devices encapsulated with materials with inadequate adhesive qualities.

The drawing shows an illustrative electronic device encapsulated in accordance with the invention; it does not suffer from these drawbacks. The device illustratively is a hybrid integrated circuit comprising a silicon chip 11 mounted on a ceramic substrate 12, the surface of the substrate including a metal layer 13 defining a circuit pattern. The metal layer 13 includes a plurality of bonding pads 14 which make connection to the semiconductor chip by metal wires 15. In accordance with the invention, the entire exposed surface of the semiconductor chip 11, the metal wires 15, the bonding pads 14, and at least part of the metal layer 13 are covered by a silicone gel 17. When the encapsulation is initially applied, it has a viscous constituency which is capable of flowing about the chip 11 and the metal wires 15 so as to encase them. Thereafter, the encapsulation 17 is hardened by curing it; but its composition is such that, while its outer texture becomes hard, it remains sufficiently flexible to constitute a shock absorber and to absorb stresses caused by differential thermal expansion and the Young's modulus of the encased elements. Specifically, during cure at about 150° C., it is important that thermal stresses do not break any of the metal wires 15.

In accordance with the invention, the resin 17 is of a material consisting essentially of 15 to 30 weight percent of silicone gel (polydimethylsiloxane and/or polymethylphenylsiloxane having vinyl and hydride functional components) with a platinum catalyst, 50 to 80 weight percent of silicon dioxide, and 4 to 20 weight percent of a silicon hydride composition. The silicon dioxide, which acts as a filler, is preferably powdered fused silica with a small amount of fumed silica. The silicon hydrides increase the cross-linking density in the silicone gel matrix to increase its hardness. The silicon dioxide improves the encapsulant solvent resistance. Both the silicon dioxide and the silicon hydrides promote the adhesion properties of the encapsulant.

The compositions of Table I were made and tested. For all of the compositions in Table I, encapsulations were made that were cured at 150° C. for two hours without electrical or mechanical failure, although it is not believed that the curing temperature is critical. The silicone gel used was in all cases DC 3-4939, a polydimethylsiloxane and polymethylphenylsiloxane silicone gel commercially available from the Dow Corning Company of Midland, MI, which contains a small amount of platinum catalyst in addition to the silicone. In all cases, the silicon hydride was in the form of polymethylhydrosiloxane, although other silicon hydride compositions could be used, as would be recognized by one skilled in the art. The polymethylhydrosiloxane used was a composition, commercially available from the Petrarch Division of Dynamit Nobel Company of Bristol, PA, and designated as "P.S. 118" or "P.S. 123". As is known, a cure temperature as low as 120° C. can be used if one is willing to tolerate a longer cure time and a cure temperature as high as 200° C. may also be used, in which case cure time may be shortened somewhat. All of the finished compositions had a Shore D hardness, as prescribed by the ASTM method, of about 30, and as such were capable of withstanding, for example, manual sharp jabs with a corner of a screwdriver without tearing or significant distortion. All were tested for adhesion by boiling in Freon TMC for 30 to 60 minutes. Freon TMC is a product commercially available from the Dupont Co. containing Freon TF (trademark), methylene chloride and a stabilizer. All showed adhesion under these conditions without swelling.

Table II shows the results of comparative temperature cycling tests made on integrated circuit chips encapsulated with the material of Example 4 of Table I, which is designated on Table II as "Ex 4". Comparable tests were made on chips coated with Furane epoxy "glop top" which is an epoxy available from the Furane Company of Los Angeles, CA, Hysol epoxy glop top which is an epoxy commercially available from the Hysol Company of Ontario, CA, and silicone glop top which is a silicone resin available from the Dow Corning Company of Midland, MI. The three encapsulations chosen for comparison are, in my opinion, the best that are currently available for this purpose.

TABLE II

| Cycles | Number Failed | | | |
|---|---|---|---|---|
| | Furane | Hysol | Ex4 | Silicone |
| 10 | 0/133 | 0/111 | 0/22 | 0/22 |
| 35 | 0/133 | 0/111 | 0/22 | 0/22 |
| 65 | 0/133 | 0/111 | 0/22 | 0/22 |
| 100 | 2/133 | 0/111 | 0/22 | 0/22 |
| 150 | 9/131 | 0/111 | 0/22 | 0/22 |
| 200 | 12/122 | 0/111 | 0/22 | 0/22 |
| 250 | 10/110 | 0/111 | 0/22 | 0/22 |
| 300 | 15/100 | 0/111 | 0/22 | 0/22 |
| 350 | 31/85 | 2/111 | 0/22 | 0/22 |
| 400 | 30/54 | 1/109 | 0/22 | 0/22 |
| 450 | 11/24 | 1/108 | 0/22 | 1/22 |
| 500 | 3/13 | 1/107 | 0/22 | 0/21 |
| 550 | 5/10 | 4/106 | 0/22 | 0/21 |
| 600 | 2/5 | 0/102 | 0/22 | 0/21 |
| 650 | 2/3 | 3/102 | 0/22 | 4/21 |
| 700 | 0/1 | 2/99 | 0/22 | 0/17 |
| 750 | 1/1 | 6/97 | 1/22 | 1/17 |
| 800 | 0/0 | 4/91 | 0/21 | 5/16 |
| 850 | 0/0 | 4/87 | 0/21 | 4/11 |
| 900 | 0/0 | 2/83 | 0/21 | 0/7 |
| 950 | 0/0 | 5/81 | 0/21 | 1/7 |
| Cum (TC | 133/133 | 35/111 | 1/22 | 16/22 |

Each test was made of an encapsulant on an integrated circuit chip containing many bonding wires susceptible to breakage under thermal stress. A break in any of the wires would constitute a failure. Each temperature cycle went from −40° to 130° C. and back to −40° C. in 45 minutes with a 20 minute dwell time at the high and low temperature extremes. The first number in each column represents the number of failures and the second number the number of samples. For example, for 100 cycles, there were two failures of 133 samples in the Furane lot; at 150 cycles, there were nine more failures of the remaining 131 samples. For 950 cycles, there was only one of 22 samples of the Ex 4 lot that failed, indicating that the invention, in conjunction with wire bonded integrated circuits, is much better at withstanding extremes of temperature than competing encapsulation compositions.

The foregoing specification is intended to be illustrative of the invention. Various modifications may be made by those skilled in the art without departing from the spirit and scope of the invention.

What is claimed is:

1. An article of manufacture comprising an electronic device encapsulated by a material including a silicone resin wherein the encapsulant material consists essentially of (a) 15 to 30 weight percent of a silcone gel selected from the group consisting of (i) polydimethylsiloxane having vinyl and hydride functional components and a platinum catalyst and (ii) polymethylphenylsiloxane having vinyl and hydride functional components and a platinum catalyst, (b) 50 to 80 weight percent of silicon dioxide, and (c) 4.5 to 16 weight percent of silicon hydride composition.

2. The article of claim 1 wherein the silicon hydride composition is polymethylhydrosiloxane.

TABLE I

| | Example 1 | | Example 2 | | Example 3 | | Example 4 | | Example 5 | | Example 6 | |
|---|---|---|---|---|---|---|---|---|---|---|---|---|
| | grams | wt % | grams | wt % | grams | wt % | grams | wt % | grams | wt % | grams | wt % |
| Silicone gel | 100 | 27 | 100 | 24 | 100 | 19.7 | 50 | 21.7 | 100 | 22.3 | 100 | 18.2 |
| Fused Silica | 205 | 56 | 250 | 61 | 328 | 64.6 | 150 | 65 | 328 | 73.2 | 425 | 77.3 |
| Fumed Silica | 0.2 | | 0.2 | | 0.2 | | 0.2 | | 0.2 | | 0.2 | |
| Silicon Hydride | 60 | 16 | 60 | 14.6 | 80 | 15.7 | 30 | 13 | 20 | 4.5 | 25 | 4.5 |

3. The article of claim 2 wherein the silicon dioxide is a mixture of fused silica and fumed silica.

4. The article of claim 1 wherein the electronic device comprises a semiconductor chip mounted on a substrate and connected to the substrate by electronic conductors, the encapsulant and the substrate together encasing the semiconductor chip and the electrical conductors.

5. A process for encapsulating a wire-bonded integrated circuit comprising the steps of mixing 15 to 30 weight percent of silicone gel selected from the group consisting of (i) polydimethylsiloxane having vinyl and hydride functional components and a platinum catalyst and (ii) polymethylphenylsiloxane having vinyl and hydride functional components and a platinum catalyst, with 50 to 80 weight percent of silicon dioxide, and 5 to 20 weight percent of a silicon hydride composition, covering the wire-bonded integrated circuit with the mixture, and curing the mixture by heating it at a temperature of 120° to 200° C. for a sufficient time to harden the mixture.

6. The process of claim 5 wherein the silicon hydride composition is polymethylhydrosiloxane.

7. The process of claim 6 wherein the silicon dioxide is a mixture of fused silica and fumed silica.

* * * * *